United States Patent [19]

Vora et al.

[11] Patent Number: 4,513,430
[45] Date of Patent: Apr. 23, 1985

[54] MISSING OR BROKEN WAFER SENSOR

[75] Inventors: Mahasukh Vora; Rajender Malhotra, both of Beverly, Mass.

[73] Assignee: Varian Associates, Inc., Palo Alto, Calif.

[21] Appl. No.: 381,290

[22] Filed: May 24, 1982

[51] Int. Cl.³ .................... G01B 11/04; G04F 10/04
[52] U.S. Cl. .................................... 377/39; 377/8; 377/24; 340/674
[58] Field of Search .................. 377/24, 39, 19, 8; 340/673, 674; 357/19

[56] References Cited

U.S. PATENT DOCUMENTS

| 3,952,944 | 4/1976 | Koyanagi et al. | 377/39 |
| 4,063,820 | 12/1977 | Borgese | 356/372 |
| 4,246,577 | 1/1981 | Shima et al. | 377/24 |
| 4,268,843 | 5/1981 | Brown et al. | 357/19 |
| 4,311,427 | 1/1982 | Coad et al. | 414/217 |

Primary Examiner—John S. Heyman
Assistant Examiner—K. Ohralik
Attorney, Agent, or Firm—Stanley Z. Cole; William R. McClellan

[57] ABSTRACT

Apparatus for sensing a missing or broken wafer in an automated wafer transfer system. The apparatus includes means for moving a wafer transfer mechanism from a first position along a prescribed path. A counter coupled to an oscillator is enabled when the wafer transfer mechanism and a wafer are moved away from the first position. A photosensor senses the presence of the wafer at a second position along the prescribed path and inhibits the counter. The count stored in the counter is compared with a predetermined count corresponding to the time required for movement of an unbroken wafer to the second position. If the counts do not agree, a missing or broken wafer is indicated and corrective action is taken.

6 Claims, 8 Drawing Figures

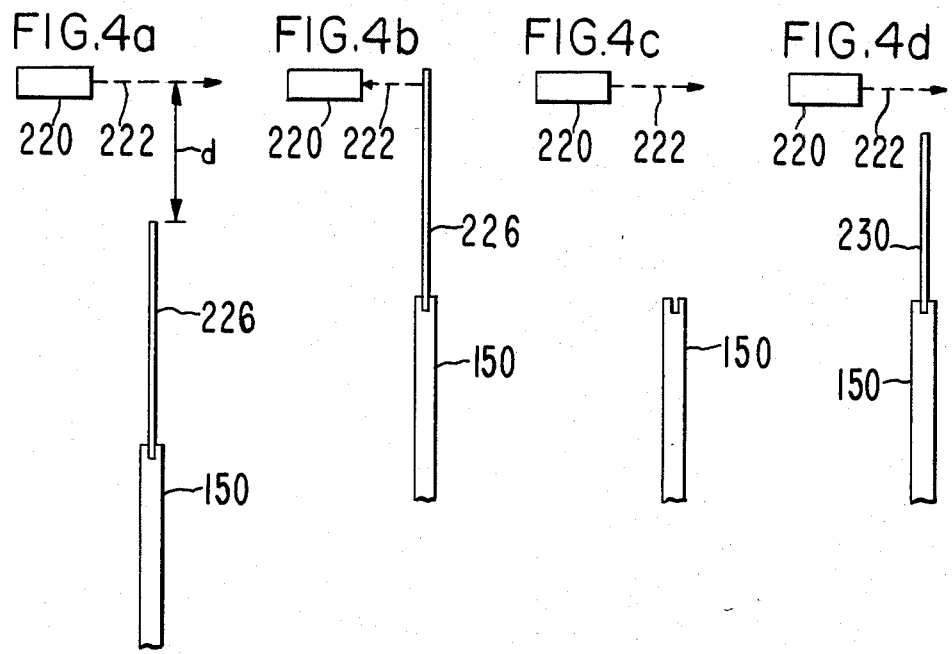
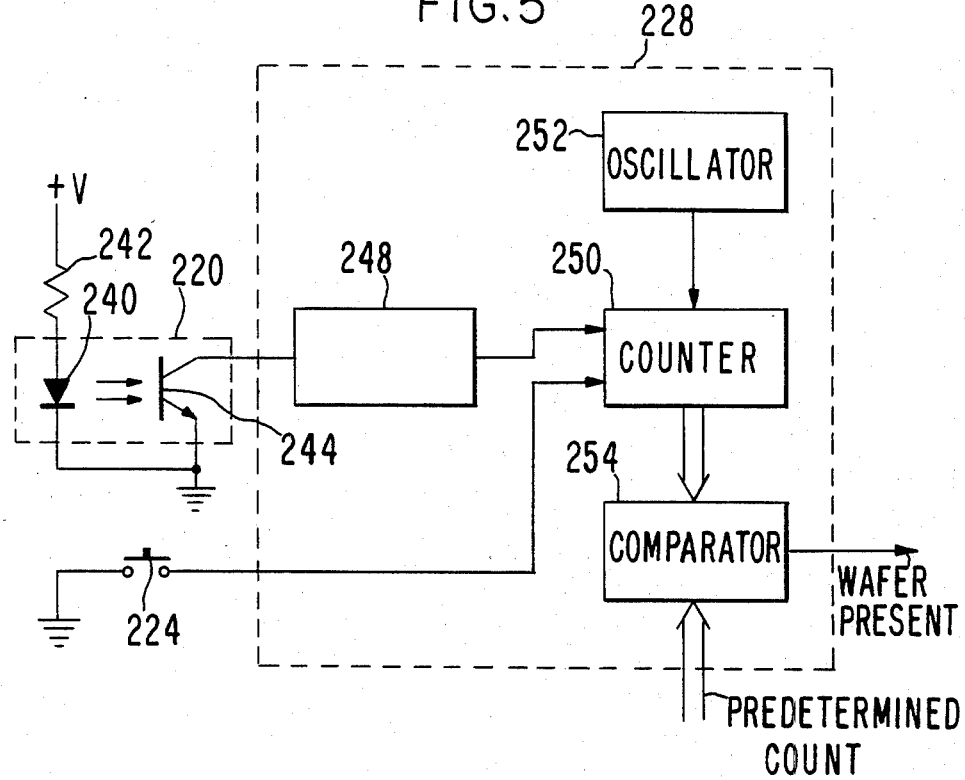

MISSING OR BROKEN WAFER SENSOR

BACKGROUND OF THE INVENTION

This invention relates to the automated transfer of semiconductor wafers between a cassette type wafer holder and a wafer processing chamber and, more particularly, relates to apparatus for sensing a missing or broken wafer in a wafer transfer mechanism.

Ion implantation has become a standard technique for introducing impurities into semiconductor wafers in a controlled and rapid manner. A beam of ions is generated in a source and directed with varying degrees of acceleration toward the semiconductor wafer. Impurities are introduced into the bulk of semiconductor wafers by using the momentum of the ions as a means of imbedding them in the crystalline lattice of the semiconductor material.

One of the major objectives in commercial semiconductor processing is to achieve a high throughput in terms of wafers processed per unit time. Rapid movement of wafers into and out of the processing chamber is one important factor in attaining high throughput. However, such wafers are highly fragile and easily damaged due to their thinness (of the order of 10 to 20 mils), large diameter (2 to 5 inches) and highly polished faces which can be rendered useless for device fabrication by many kinds of contamination, abrasion or damage. Thus, extraordinary handling precautions are required and manual wafer handling is undesirable.

In serial ion implantation systems, one wafer at a time is processed and the ion beam is electrostatically scanned over the surface of the wafer until the desired impurity dosage is reached. Such systems are usually smaller and less expensive than batch processing systems. However, the wafer transfer time is critical to throughput, since it occurs each time a wafer is processed.

To assist in achieving high throughput, automated wafer transfer systems have been developed. These systems typically transfer wafers from a wafer carrier, or cassette, into a wafer processing chamber and then back into the cassette without intervention by an operator. In one type of automated system, the cassette is mounted vertically with the wafers in a horizontal orientation. The wafers are transferred to and from the processing chamber by various combinations of vacuum picks, air tracks, moving belts and gravity. While such systems provide generally satisfactory operation, there is a tendency for particles to drop on the horizontally oriented wafers and cause contamination.

Automated wafer transfer systems, in which the wafers are maintained in a vertical orientation in the cassette and during transfer to and from the processing chamber, are disclosed in Hertel et al, "Wafer Transfer System," filed concurrently herewith, and now U.S. Pat. No. 4,449,885 issued May 22, 1984 and in U.S. Pat. No. 4,311,427, issued Jan. 19, 1982 to Coad et al. An elevator blade edgewise lifts a wafer out of a cassette from below and raises it to a vacuum chuck positioned in the door of a processing chamber. The vertical wafer handling system reduces particulate contamination and, due to the edgewise handling of the wafers, reduces abrasion and damage thereof.

Occasionally, a cassette will have less than its full complement of wafers or will have one or more empty slots due to previous breakage or operator error. Furthermore, the cassette may contain one or more broken wafers when it is introduced into the wafer transfer system. Finally, regardless of the care taken in handling wafers, occasional breakage of wafers is caused by the wafer transfer system itself. When such conditions occur, it is necessary either to stop the system to remove the broken wafer or to cause the system to skip over the missing wafer position without attempting to process it. Operation of the processing system with a missing or broken wafer not only wastes valuable machine time but also creates the risk of damage to the machine or to other wafers. When an ion implantation system is run without a wafer, the ion beam strikes either a metal platen or a thermally conductive rubber pad causing damage and, in the case of the metal platen, sputtering. Therefore, sensor apparatus is required for detecting a missing or broken wafer in the wafer transfer mechanism.

It is, therefore, an object of the present invention to provide novel apparatus for detecting a missing or broken wafer in a wafer transfer mechanism.

It is another object of the present invention to provide apparatus for sensing a missing or broken wafer in a wafer transfer mechanism without mechanically contacting the wafer.

It is yet another object of the present invention to provide apparatus for sensing a missing or broken wafer in a wafer transfer mechanism wherein the apparatus can be easily programmed for various wafer sizes.

SUMMARY OF THE INVENTION

According to the present invention, these and other objects and advantages are achieved in apparatus for detecting a missing or broken semiconductor wafer in a wafer transfer mechanism. The apparatus comprises means for moving the wafer transfer mechanism from a first position along a prescribed path, first sensing means and second sensing means. The apparatus further comprises oscillator means and counter means having a count input coupled to an output of the oscillator. The first sensing means is operative to enable operation of the counter means upon sensing movement of the wafer transfer mechanism from a first position. The second sensing means is operative to inhibit operation of the counter means upon sensing the presence of the wafer at a second position along the prescribed path. The apparatus still further comprises comparator means operative to compare the actual count in the counter means with a predetermined count corresponding to the time required for movement by the wafer transfer mechanism of an unbroken wafer to the second position. The comparator means provides an output signal having one state if the actual count and the predetermined count are equal and having another state if the actual count and the predetermined count are not equal. The other state indicates a missing or broken wafer.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIGS. 4a–4d illustrate the operation of the sensor in detecting the presence of a wafer in the wafer transfer mechanism; and FIG. 5 is a schematic diagram of the sensor apparatus in accordance with the present invention.

DETAILED DESCRIPTION OF THE INVENTION

Figure 1:
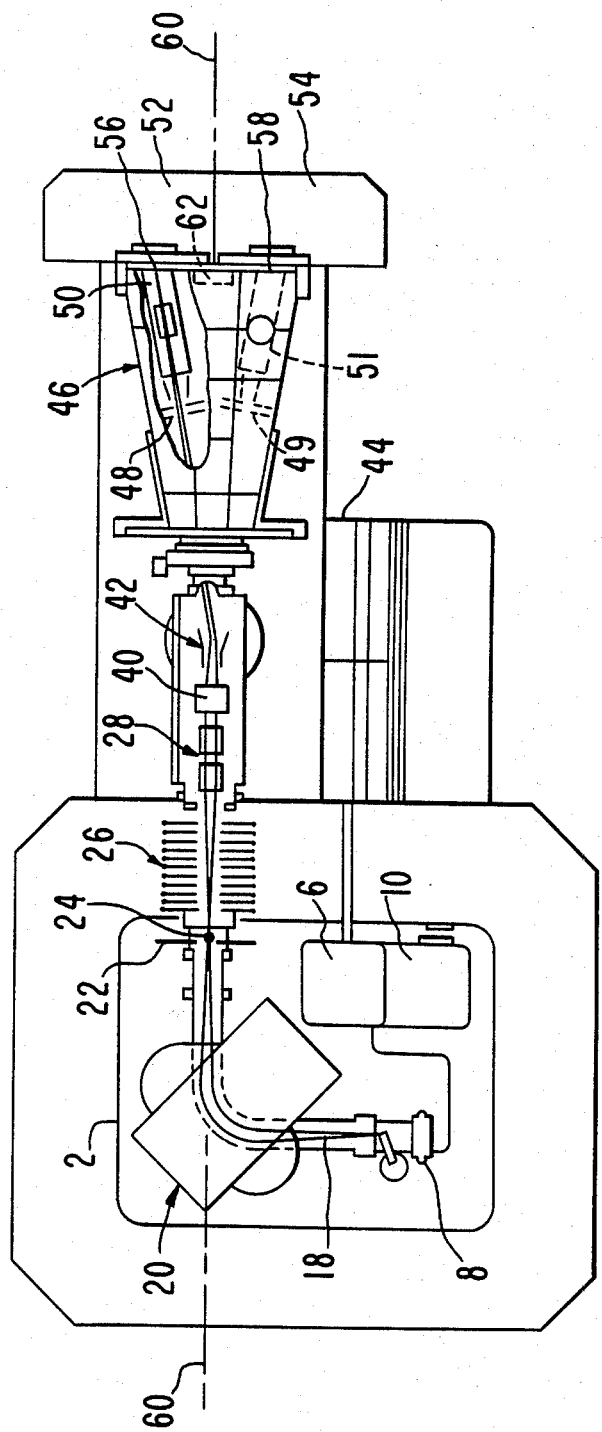
FIG. 1 is a schematic diagram, viewed from above, of an ion implantation system.

The sensor apparatus according to the present invention is typically used in an ion implantation system. An example of an ion implantation system is illustrated in FIG. 1. A high voltage terminal 2 is held at high potential relative to ground by a high voltage power supply (not shown). The terminal 2 houses the apparatus required to form a beam of ions of desired species. In common practice, a gaseous feed stock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as a quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates to form the desired scanning pattern are provided by a scanning system 44.

A dual target chamber 46 includes a housing, beam defining masks 48, 49 and Faraday cages 50, 51 for beam monitoring. Automatic wafer transfer systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. Target positions 56, 58 are typically located within air locks, as described hereinafter, and are displaced horizontally on opposite sides of the longitudinal axis 60 of the undeflected beam 18 such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
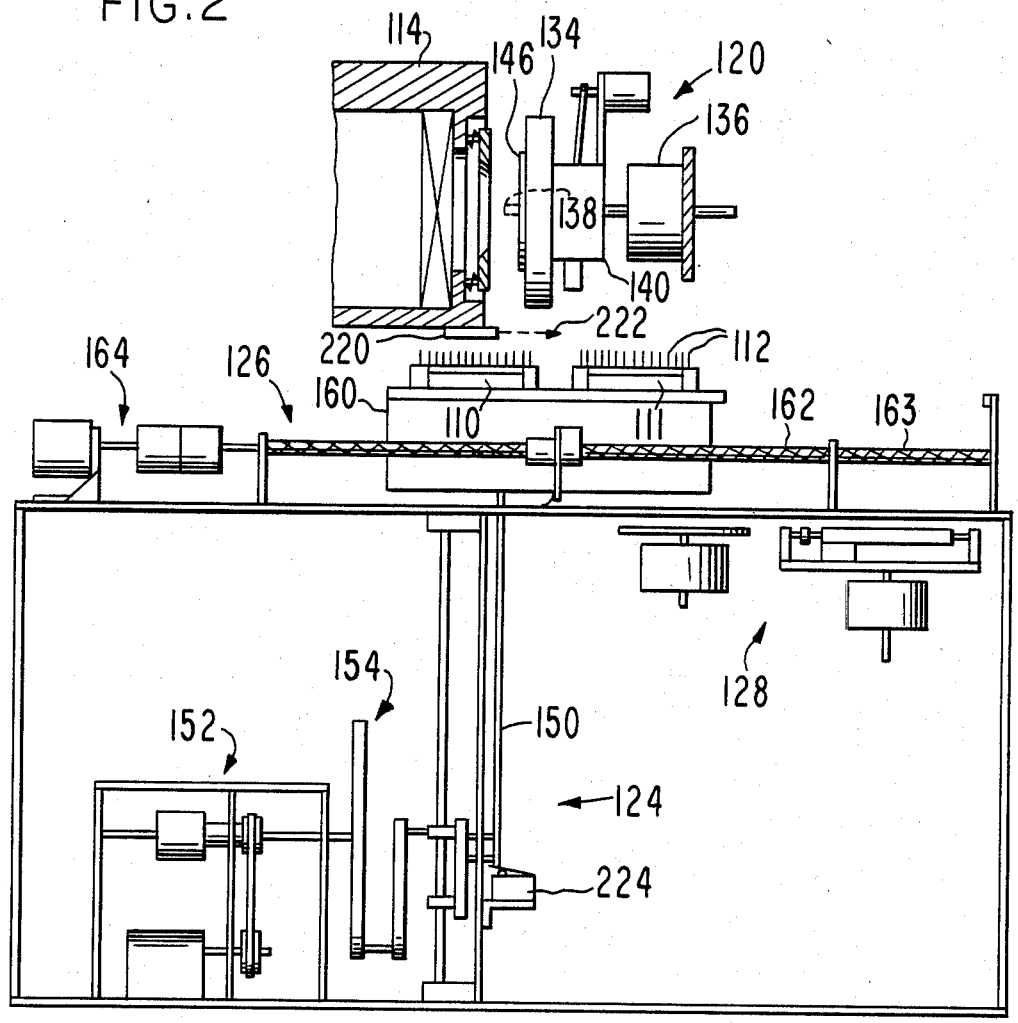
FIG. 2 is a simplified side elevation of an automated wafer transfer system with the elevator blade lowered.

An automated wafer transfer system corresponding to the systems 52, 54 in FIG. 1, is illustrated in simplified form in FIG. 2. The system automatically transfers generally circular semiconductor wafers, one at a time, between cassettes 110, 111 each holding a plurality of wafers 112 and a wafer processing chamber 114. The cassettes 110, 111 each include a plurality of parallel slots for holding the wafers 112 in an upright, parallel position and are used for transporting and temporarily storing the wafers 112. The cassettes 110, 111 are typically a plastic material and, in the system of FIG. 2, must have open bottoms to provide access to the wafers 112 from below. The wafer processing chamber 114 is a vacuum chamber and, in the present example, is an end station for serial ion implantation of wafers.

The wafer transfer system shown in FIG. 2 includes wafer handling means 120 associated with an entrance to the processing chamber 114 for receiving a wafer and moving the wafer into the processing chamber 114. The transfer system further includes transfer means 124 for transporting the wafer between the cassettes 110, 111 and the wafer handling means 120 and cassette conveyor means 126 for positioning the cassettes 110, 111 relative to the transfer means 124. The system still further includes means 128 for prealigning a guide flat on each of the plurality of wafers 112 in the cassettes 110, 111.

The wafer handling means 120 includes a chamber door 134, means 136 for moving the chamber door 134 between an open position, as shown in FIG. 2, and a sealed position, and means for engaging the wafer and rotating it through a preselected angular displacement. The means for engaging the wafer and rotating it includes a rotatable vacuum chuck 138, means enclosed within a housing 140 for moving the vacuum chuck 138 between a wafer-receiving position (as indicated by dotted lines in FIG. 2) and a retracted position and means for rotating the vacuum chuck 138 through the preselected angular displacement. The chamber door 134 typically includes a wafer-receiving surface, or platen 146, against which the wafer is held during processing and means (not shown) for cooling the platen 146.

The transfer means 124 includes an elevator blade 150, drive means 152 and crank means 154 coupling the drive means 152 to the elevator blade 150 and converting the rotary motion of the drive means 152 to linear blade 150 motion. The drive means 152 typically includes a motor and a mechanical stepper. The elevator blade 150 has an arcuate leading edge provided with a groove adapted to engage edgewise a wafer in the cassettes 110, 111 from below and raise the wafer to the wafer handling means 120.

The cassette conveyor means 126 includes a cassette holder 160 coupled to a ball reverser 162 positioned on one side and to a guide shaft 163 positioned on the opposite side of the holder 160. The conveyor means 126 further includes drive means 164 for actuating the ball reverser 162 and stepwise or continuously moving the holder 160 along a linear path. The drive means 164 typically includes a motor, a slip clutch and a mechanical stepper. For additional information relating to the automated wafer transfer system illustrated in FIG. 2, reference is made to Hertel et al, "Wafer Transfer System," filed concurrently herewith and now U.S. Pat. No. 4,449,885 issued May 22, 1984.

Mounted above the cassette conveyor means 126 in a position adjacent to the path of the elevator blade 150 is a sensor 220 which emits a radiant beam 222 across the path of the elevator blade 150. The beam 222 from the sensor 220 is typically infrared radiation or visible light. The sensor 220 is further operative to receive a reflection of the beam 222 from a passing wafer or from the elevator blade 150 and to produce an output signal in response to the reflected beam 222. The sensor 220 can be mounted in any convenient manner and, in the present example, is mounted to the underside of the processing chamber 114. Mounted below the lowered position of the elevator blade 150 is a switch 224 which is operative to sense the movement of the elevator blade 150 from the lowered position. The switch 224 is mounted so as to be in one state when the elevator blade is in its lowered position and to be actuated to its other state as soon as the elevator blade 150 moves from the lowered position.

Figure 3:
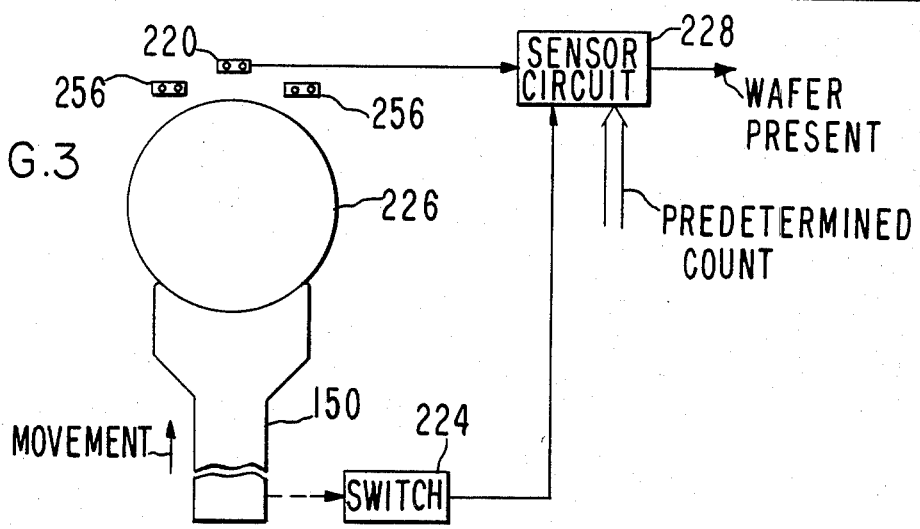
FIG. 3 is a schematic block diagram of the sensor apparatus in accordance with the present invention.

Apparatus for detecting a missing or broken semiconductor wafer in the wafer transfer mechanism of FIG. 2 is shown in schematic form in FIG. 3. A wafer 226 is engaged edgewise by the elevator blade 150 and is raised vertically. The sensor 220 and the switch 224 have outputs coupled to a sensor circuit 228. The sensor circuit 228 also receives a PREDETERMINED COUNT input which varies with the size of the wafers being processed, as described hereinafter. A WAFER PRESENT output of the sensor circuit 228 indicates that an unbroken wafer is present in the elevator blade 150.

The operation of the sensor 220 under various conditions is illustrated in FIGS. 4a–4d. In FIG. 4a, there is shown the wafer 226 engaged in the elevator blade 150 in the lowered position. The sensor 220 is a distance d above the top of the wafer 226 and the beam 222 is not reflected. As described hereinafter, the sensor circuit 228 expects to receive a signal indicative of a reflected beam at a prescribed time during the raising of the elevator blade 150. FIG. 4b illustrates proper operation of the system with the wafer 226 having been raised by the elevator blade 150 so that the top of the wafer 226 is adjacent to sensor 220. The beam 222 is reflected by the wafer 226, and the sensor 220 provides an output signal which is processed by the sensor circuit 228. FIG. 4c illustrates the case of a missing wafer. The elevator blade 150 has been raised to the position where a reflection should be received by the sensor 220. Due to the absence of the wafer, no reflection is received and no output signal is provided by the sensor 220. FIG. 4d illustrates a case of a broken wafer 230. The upper portion of the wafer 230 has been broken off. The elevator blade 150 has been raised to the position where a reflection should be received by the sensor 220. Due to the missing portion of the wafer 230, no reflection is received and no signal is provided by the sensor 220 to the sensor circuit 228.

Referring now to FIG. 5, there is shown a schematic diagram of the sensor circuit 228, the sensor 220 and switch 224. The sensor 220 typically includes a light-emitting diode 240 coupled through a current limiting resistor 242 to a source of voltage, +V, and a phototransistor 244 having its collector coupled to the sensor circuit 228. One preferred sensor 220 is a type S13224 manufactured by Skan-A-Matic Corp. Light emitted by the diode 240 is reflected from the wafer and is received by the phototransistor 244 which produces an output current. The sensor circuit 228 includes an amplifier 248 which receives the output of the phototransistor 244 and converts it to a logic-compatible signal. Such amplifiers are generally known in the art. The output of the amplifier 248 is coupled to an inhibit input of a digital counter 250, which can be, for example, one or more type 74161 binary counters. The switch 224, which, as described hereinabove, senses movement of the elevator blade 150, is coupled to an enable input and to a reset input of the counter 250. A free running oscillator 252, operating at a frequency F, has an output coupled to the count, or clock, input of the counter 250. The counter 250 thus advances at a frequency F when it is enabled. The outputs of the counter 250 are coupled to one set of inputs of a digital comparator 254 which can be, for example, one or more type 7485 comparators. The PREDETERMINED COUNT signal is coupled to the other set of inputs of the comparator 254. The comparator 254 can compare the two sets of inputs and determine whether one is equal to, greater than or less than the other.

The automated operation of the wafer transfer system described herein is controlled by a system controller (not shown) which actuates each mechanism at a prescribed time and for a prescribed duration. The controller can be a dedicated electronic controller or can be a computer operating through appropriate interface circuits. Initially, an operator places the cassettes 110, 111 in the cassette holder 160 positioned at the right end of the cassette conveyor means 126 and initiates operation of the system. The holder 160 is moved by the ball reverser 162 and the drive means 164, first to a position above the means 128 for prealignment, and then to a position in which one of the wafers 112 is directly above the elevator blade 150. The blade 150 is raised by operation of the drive means 152 and the crank means 154 until it contacts the wafer from below. The blade 150 moves upward through the cassette 110 and lifts the wafer to a position adjacent the open chamber door 134. The vacuum chuck 138 is extended outwardly from the chamber door 134 to a wafer-receiving position and holds the wafer through operation of vacuum suction upon the rear surface of the wafer. The elevator blade 150 is then lowered. The wafer is rotated to a desired orientation and the door 134 is closed for processing of the wafer. When processing of the wafer has been completed, the chamber door 134 is opened, the vacuum chuck 138 is extended and the elevator blade 150 is raised to engage the wafer. At this time, the vacuum chuck 138 releases the wafer, and the elevator blade 150 lowers the wafer back into the cassette. This process is repeated for each of the wafers in the cassettes 110, 111.

In the lowered position of the elevator blade 150, the switch 224 is in a closed state which inhibits the counter 250 and no reflected beam 222 is received by the sensor 220. As the elevator blade 150 begins to move upward, the switch 224 is actuated to an open position and simultaneously resets and enables the counter 250. The oscillator 252 now advances the state of the counter 250 at a rate F equal to the frequency of the oscillator 252. As the elevator blade 150 and the wafer move upward, the counter advances until the upper edge of the wafer intercepts the beam 222, as illustrated in FIG. 4b. At this time, the phototransistor 224 receives the beam 222 reflected from the wafer 226 and provides an output to the amplifier 248. The amplifier 248 in turn provides a signal which inhibits the counter 250 from further counting. Thus, the counter advances during the time between the start of movement of the elevator blade 150 and the interception of the beam 222 by the wafer 226. The count N in the counter 250 can be given by N=FT where T is the above-described time interval required for the wafer to be raised to the level of the sensor 220. If, however, no wafer is present, as shown in FIG. 4c, no reflected beam 222 is received by the sensor 220 until the elevator blade 150 is raised to the level of the sensor 220 and intercepted by the beam 222. If the wafer is broken, as shown in FIG. 4d, no reflected beam 222 is received until the remaining portion of the broken wafer 230 is raised to the level of the sensor 220. In either case, more time elapses until the counter 250 is inhibited and a larger count is made.

After the counter 250 has been inhibited by the amplifier 248, the count N in the counter 250 is evaluated by the comparator 254 to determine whether the stored count N indicates a missing or broken wafer. Since the velocity v of the elevator blade 150, the distance d between the wafer 226 and the sensor 220 and the frequency F of oscillator 252 are all known, a predetermined, or expected, count PC can be determined in advance and supplied to the comparator 254. When the actual count N in the counter 250 agrees with the predetermined count PC, the comparator 254 provides a WAFER PRESENT signal in one state, such as a logic one, indicating the presence of an unbroken wafer. When the actual count N and the predetermined count PC are not equal, the WAFER PRESENT signal is in another state, such as a logic zero, indicating a missing or broken wafer, and appropriate corrective action is taken. The sensor circuit 228 is programmable, by changing the PREDETERMINED COUNT input, to accommodate for changes in velocity v, distance d, or frequency F. It will be realized that the predetermined count PC can vary for different wafer sizes since the distance d between the top of the wafer 226 and the beam 222 is likely to be different. The PREDETERMINED COUNT signal can be supplied from a set of panel switches or from a computer.

It will be understood that the start and stop points of counter 250 can be arbitrarily chosen. For example, the sensor 220 can be positioned at any convenient distance d above the wafer 226, and the switch 224 can sense an intermediate position of the elevator blade 150. The frequency F of the oscillator 252 must be high enough to produce a reasonable resolution in detecting broken wafers, but must not be so high that dimensional variations in the wafers and in the elevator blade 150 produce erroneous WAFER PRESENT outputs. In one example of the present invention, the frequency F was about 100 Hz. The crank means 154 used in the wafer transfer system of FIG. 2 provides a variable velocity v as the elevator blade 150 is raised and lowered. The time T required by this mechanism to raise the elevator blade 150 through the distance d can be determined from $$T = \int_0^d \frac{1}{v(y)} dy$$

where
v = instantaneous velocity of the elevator blade 150
y = vertical position of elevator blade 150 (y=0 at lowered position of blade 150)
and the predetermined count PC is given by $$PC = F \int_0^d \frac{1}{v(y)} dy$$

In the case of constant velocity V, PC is given by $$PC = \frac{Fd}{v}$$

With respect to broken wafers, the apparatus shown and described hereinabove only detects breaks in the upper center portion of the wafer. Thus, for example, when the left or right side of the wafer is broken off, this fact is not detected by a single, centrally located sensor 220. The capability of the detection system can be improved by adding additional sensors 256 at various positions with respect to the wafer as shown in FIG. 3. Each of the additional sensors 256 is positioned above a point on the wafer and is connected to a separate sensor circuit. When any one of the WAFER PRESENT signals is missing, a missing or broken wafer is indicated. When each of the sensors 256 is spaced above the wafer by the distance d, all sensors 256 are tripped by an unbroken wafer at the same time.

While a reflective wafer sensor has been shown in the sensor apparatus according to the present invention, it will be obvious that a sensor and an emitter can be positioned on opposite sides of the path travelled by the wafer. Normally, the beam from the emitter is received directly by the sensor. When the wafer passes between the emitter and the sensor, the beam is broken and a signal is provided to the sensor circuit. However, it has been found that this type of sensor does not work reliably with semitransparent SOS wafers.

Thus, there is provided by the present invention apparatus for sensing a missing or broken wafer in a wafer transfer mechanism. The apparatus is simple and low cost and can be programmed to sense wafers of various sizes and to accommodate various wafer transfer speeds.

While there has been shown and described what is at present considered the preferred embodiments of the invention, it will be obvious to those skilled in the art that various changes and modifications may be made therein without departing from the scope of the invention as defined by the appended claims.

What is claimed is:

1. Apparatus for detecting a condition wherein a wafer in a wafer transfer mechanism is missing or broken, said apparatus comprising:
   transfer means for moving said wafer from a first position along a prescribed path to a second position;
   oscillator means;
   counter means having a count input coupled to the output of said oscillator;
   first sensing means for sensing movement of said transfer means from said first position along said prescribed path and for thereupon enabling said counter means;
   second sensing means for non-contact sensing of said wafer in said transfer means at an intermediate position along said prescribed path without interrupting the movement of said wafer and for thereupon inhibiting said counter means, said second sensing means comprising a light emitting element having a beam directed laterally across said prescribed path and a photosensor directed laterally across said prescribed path and positioned to receive said beam; and
   comparator means for comparing the accumulated count in said counter means with a predetermined count representing the presence of a non-broken wafer and for providing an output signal of a first state when the accumulated count equals the predetermined count and of a second state when the accumulated count and the predetermined count are not equal,
   said second state of said comparator output signal representing said condition wherein said wafer is broken or missing.

2. The apparatus as defined in claim 1 wherein said photosensor is positioned to receive said beam after reflection from a surface of said wafer traversing said prescribed path.

3. Apparatus for detecting a condition wherein a wafer in a wafer transfer mechanism is missing or broken, said apparatus comprising:

transfer means for moving said wafer from a first position along a prescribed path to a second position;

first sensing means for sensing movement of said transfer means from said first position along said prescribed path and thereupon providing a first sensing signal;

a plurality of second sensing means positioned along said prescribed path for non-contact sensing of predetermined different portions of said wafer surface without interrupting the movement of said wafer, and thereupon providing second sensing signals; and a plurality of sensor circuits, each associated with one of said second sensing means and including means for determining the measured time between said first sensing signal and each associated second sensing signal, and means for providing an output signal only when each said measured time is equal to a respective, associated predetermined time, whereby breaks in said predetermined different portions of said wafer surface are detected.

4. The apparatus as defined in claim 3 wherein said sensor circuits each include oscillator means, counter means having a count input coupled to the output of said oscillator, said counter means being enabled by said first sensing signal and inhibited by the associated second sensing signal, and comparator means for comparing the accumulated count in said counter means with a predetermined count and for providing said output signal of a first state when the accumulated count and the predetermined count are equal and of a second state when the accumulated count and the predetermined count are not equal.

5. The apparatus as defined in claim 4 wherein said second sensing means are positioned to match the shape of the leading edge of the wafer so that said second sensing signal occur substantially simultaneously when an unbroken wafer is present in said transfer means.

6. The apparatus as defined in claim 5 wherein said second sensing means each comprise a light emitting element having a beam directed laterally across said prescribed path and a photosensor directed laterally across said prescribed path and positioned to receive said beam after reflection from said predetermined portion of said wafer surface.

* * * * *